(12) United States Patent
Wegdal

(10) Patent No.: US 6,312,506 B1
(45) Date of Patent: Nov. 6, 2001

(54) METHOD FOR REDUCING MOISTURE CONTENT WITHIN A HOUSING BY REDUCING THERMAL INERTIA ON A SIDE OF THE HOUSING

(75) Inventor: Carl Göran Wegdal, Skärholmen (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/525,484

(22) Filed: Mar. 15, 2000

Related U.S. Application Data

(62) Division of application No. 09/328,387, filed on Jun. 9, 1999.

(30) Foreign Application Priority Data

Jun. 16, 1998 (SE) .................................................. 9802141
Jul. 10, 1998 (SE) .................................................. 9802508

(51) Int. Cl.$^7$ .................................................. B01D 53/00
(52) U.S. Cl. .................................................. 95/289; 96/221
(58) Field of Search ................... 95/288, 289; 96/221; 220/676; 229/120; 361/714, 690

(56) References Cited

U.S. PATENT DOCUMENTS

| 3,302,697 | 2/1967 | Jacko . |
| 3,462,553 | 8/1969 | Spranger . |
| 3,621,339 | 11/1971 | Hodgson . |
| 3,639,809 | 2/1972 | Phileger, Jr. . |
| 3,857,044 | 12/1974 | Papoi et al. . |
| 3,925,710 | 12/1975 | Ebert . |
| 4,256,919 | 3/1981 | Berg . |
| 4,589,546 | * 5/1986 | Sunderland ..................... 206/315.11 |
| 4,620,263 | 10/1986 | Ito . |
| 5,334,799 | 8/1994 | Naito et al. . |
| 5,373,809 | 12/1994 | Sphar . |
| 5,650,591 | 7/1997 | Matsushita et al. . |
| 5,671,697 | 9/1997 | Rutman . |
| 5,842,514 | * 12/1998 | Zagach et al. ...................... 361/714 |
| 5,884,486 | * 3/1999 | Hughes et al. ........................ 62/3.4 |
| 5,892,654 | 4/1999 | Worden, Jr. . |
| 5,912,800 | 6/1999 | Sammakia et al. . |
| 5,923,532 | 7/1999 | Nedved . |
| 5,936,839 | 8/1999 | Saito . |

OTHER PUBLICATIONS

U.S. application No. 09/328,387, filed Jun. 9, 1999.

* cited by examiner

Primary Examiner—David A. Simmons
Assistant Examiner—Robert A. Hopkins
(74) Attorney, Agent, or Firm—Nixon & Vanderhye P.C.

(57) ABSTRACT

The present invention related to a method and a device for reducing the number of water vapour molecules per unit volume in a housing (1) by providing an end (11) of the housing (1) which has a lower thermal inertia than the rest of the housing with perforations (15). When the temperature outside the housing (1) falls some of the more energetic water vapour molecules in the housing (1) will leave the housing (1) via the perforations (15) and a small number of the less energetic molecules will enter the housing from the surroundings. This will lead to a nett flow of water vapour molecules out of the housing (1).

4 Claims, 3 Drawing Sheets

METHOD FOR REDUCING MOISTURE CONTENT WITHIN A HOUSING BY REDUCING THERMAL INERTIA ON A SIDE OF THE HOUSING

This is a divisional of application Ser. No. 09/328,387, filed Jun. 9, 1999, now pending the entire content of which is hereby incorporated by reference in this application.

TECHNICAL FIELD OF THE INVENTION

The present invention relates to a device and a method for housing moisture sensitive components of the type mentioned in the preambles of the independent claims.

DESCRIPTION OF RELATED ART

Moisture sensitive components, especially sensitive electronic components, are often protected from the effects of humidity in the air by being placed in air-tight housings. There are however situations when it is not desirable to have a completely sealed casing around such components. For example there are components and devices which have to work in an operating range of from −55° C. to +65° C. If they are housed in air-tight housings then the pressure changes caused by the expansion of the air inside said housings when the temperature changes from the lower temperature to the upper temperature require that the housings have a strong and comparatively expensive construction Furthermore any water vapour contained in the housing when the housing was sealed at, for example, room temperature can condense out at lower temperatures. If the housing is not sealed then external temperature falls lead to a temporary underpressure in the housing until air has flowed into the housing. When the external temperature rises then there is a temporary overpressure in the housing and external air flows out of the housing until this pressure difference between the inside and the outside of the housing no longer exists. The air flow into the housing entrains water vapour with it and this vapour can condense out to form water droplets inside the housing when the temperature falls the next time.

Another way of reducing the influence of water vapour on components in a housing is to leave small vent holes in the housing so that it is no longer airtight and to provide heating means inside the housing. If there are no heating means in the housing then as the temperature drops the relative humidity of the air in the housing rises and eventually condensation forms on the enclosed components. The heating means prevents the temperature in the housing from dropping to such a low level that the dew point is reached and thereby prevents moisture condensing on the enclosed components. This however consumes energy.

SUMMARY

The object of the present invention is to provide a method and a device which can overcome the problem of how to protect sensitive components from water vapour in the air when the components are housed in protective housing which are not airtight.

Normally if a housing is outdoors or is in a normal unsealed room or space which undergoes diurnal changes in temperature then there is a continuous exchange of air from the surroundings to the inside of a ventilated housing through the vent holes due to differences between the ambient temperature and ambient pressure and the temperature and pressure inside the housing. The vent holes are only intended to even out the pressure differences which occur between the inside of the housing and the surroundings and the flow of air though them is small. However the random motion of water molecules in the water vapour in the air allows them to enter or leave the casing independently of any air flow through the vent holes.

When a housing at a certain temperature containing air with a certain relative humidity is cooled, for example when night falls, the air inside the casing may cool to below its dew-point temperature, thereby causing water vapour to condense out on the components inside the housing. When the casing warms up again this moisture can evaporate as the warmer air is able to absorb more water vapour. Therefore there is only a risk of condensation occurring when the temperature of a casing falls. If the water vapour inside a casing can be removed at a rate equal to, or faster than, that required to keep the relative humidity low enough to prevent condensation then condensation in the housing during falling temperatures can be avoided.

There can occur times when the number of molecules of water vapour per unit volume inside the housing is the same as the number of molecules of water vapour per unit volume outside the housing. If the water molecules inside the housing are at the same temperature as the water molecules outside the housing then they will have the same average energy and if the number of molecules of water vapour per unit volume inside the housing is the same as the number of molecules of water vapour per unit volume outside the housing then there will be no nett exchange of molecules between the interior and exterior of the housing.

If there is a difference in the number of molecules of water vapour per unit volume inside the housing and the number of molecules of water vapour per unit volume outside the housing, and both the housing and its surroundings are at the same temperature then there will be a nett flow which will tend to reduce the difference until a steady state is reached in which the average flow in and out of the housing is the same.

If the housing and its surroundings are at different temperatures then when the steady state of water molecule flow is reached then there will be a difference in the number of molecules per unit volume inside the housing and the number of molecules per unit volume outside the housing. This is because, if, when staring from a state where there are equal numbers of water molecules per unit volume both inside and outside the housing, a temperature difference arises between the interior and exterior of the housing then there will be a nett flow of water molecules from the warmer region to the colder region. This is because more of the higher energy water molecules in the warmer region will pass through the vent holes than the lower energy molecules in the colder region. This will lead the warmer region becoming relatively less humid than the colder region. Thus if the ambient temperature outside a housing falls then there should theoretically be a nett flow of molecules out of the housing until the temperature of the housing falls and a new equilibrium state is reached. If in the new equilibrium state the housing is still warmer than the surroundings due to, for example, heat given off by components contained in it, then the number of molecules per unit volume inside the housing will be less than the number of molecules per unit volume outside the housing. In other words it will be less humid inside the housing.

In practice the difference in the number of molecules per unit volume inside the housing and outside the housing caused by cooling of the surroundings is less than the theoretical maximum because of heating of the air in the immediate vicinity of the vent holes by the walls of the casing. This problem is caused by the water molecules on the outside of the housing near to the vent holes have substantially the same average energy as the molecules on the inside of the casing near to the vent holes and the nett flow of water molecules through the vent holes becomes zero.

An object of the present invention is to overcome this problem.

According to the present invention the above stated problem is solved by providing a housing which has means, preferably passive means, for producing a difference in the average velocity of water molecules inside and outside of the housing in the vicinity of vent holes provided in the housing wherein the water molecules inside the housing have a higher average velocity than the molecules outside the housing. In this way there will be a nett transfer of water molecules from inside the casing to outside the casing thereby resulting in a reduction in the humidity inside the casing.

In a preferred embodiment of the invention the passive means for producing a difference in the average velocity of water molecules inside and outside of the housing in the vicinity of vent holes provided in the housing comprises that the wall of the housing in the vicinity of the vent hole or holes is constructed so that it has a lower thermal inertia than the rest of the housing and is thermally insulated from the rest of the housing. In this way when the ambient temperature outside of the housing falls then the temperature of said wall of the housing will fall more quickly than the temperature of the rest of the housing and the inside of the housing. Water molecules in the air near to this wall therefore lose energy (and speed). Thus water molecules in the interior of the housing at a distance from the portion will on average have more energy than those outside the housing. Thus, on average, a greater number of higher energy water molecules will leave the housing than lower energy water molecules will go into it.

In order to avoid consuming energy the water molecules inside the housing are preferably heated by waste heat normally given off by the components enclosed in the housing.

The invention will be described more closely by means of non-limiting examples of embodiments and with reference to the accompanying figures.

DETAILED DESCRIPTION OF THE EMBODIMENTS

Figure 1:
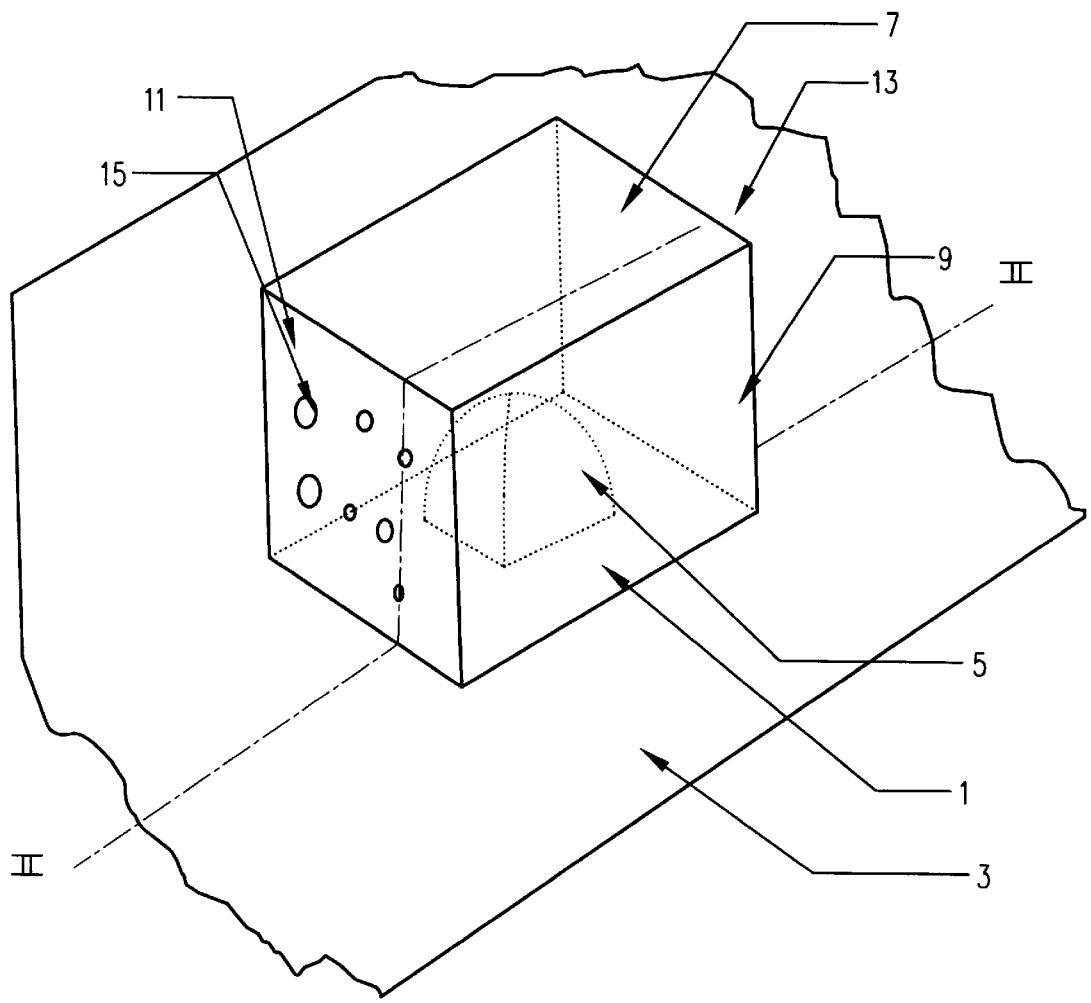
FIG. 1 shows a perspective view of an embodiment of a housing made in a accordance with the present invention.

FIG. 1 shows a perspective view of a housing 1 in accordance with the invention.

Housing 1 is mounted on a supporting surface, for example a printed circuit board 3 and encloses a component 5, which may also be a printed circuit board. In this embodiment housing 1 has the shape of a rectangular box but it can have any suitable shape. In order to simplify the description the generic word "side" is used to describe a wall or top surface or base of a rectilinear housing. The word "side" also is intended to refer to the casing of a curvilinear, e.g. hemispherical, housing. Housing 1 is comprised of a top side 7, preferably but not obligatorily a bottom side 7', two long sides 9, a first short side 11 and a second short side 13. First short side is perforated by a plurality of through holes 15. Holes 15 can be of any suitable shape and preferably have a maximum diameter or width of between 20–0.01 mm and most preferably between 5 mm–0.5 mm. Larger holes allow excessive amounts of air flow and leave the component exposed to electromagnetic interference while smaller holes risk being blocked by water droplets or airborne contaminants. Housing 1 can be made of any material suitable for protecting the enclosed component 5, for example plastic, metal e.g. aluminum, copper, stainless steel, brass etc., composite material such as fibre reinforced materials, wood, rubber, etc.

Figure 2:
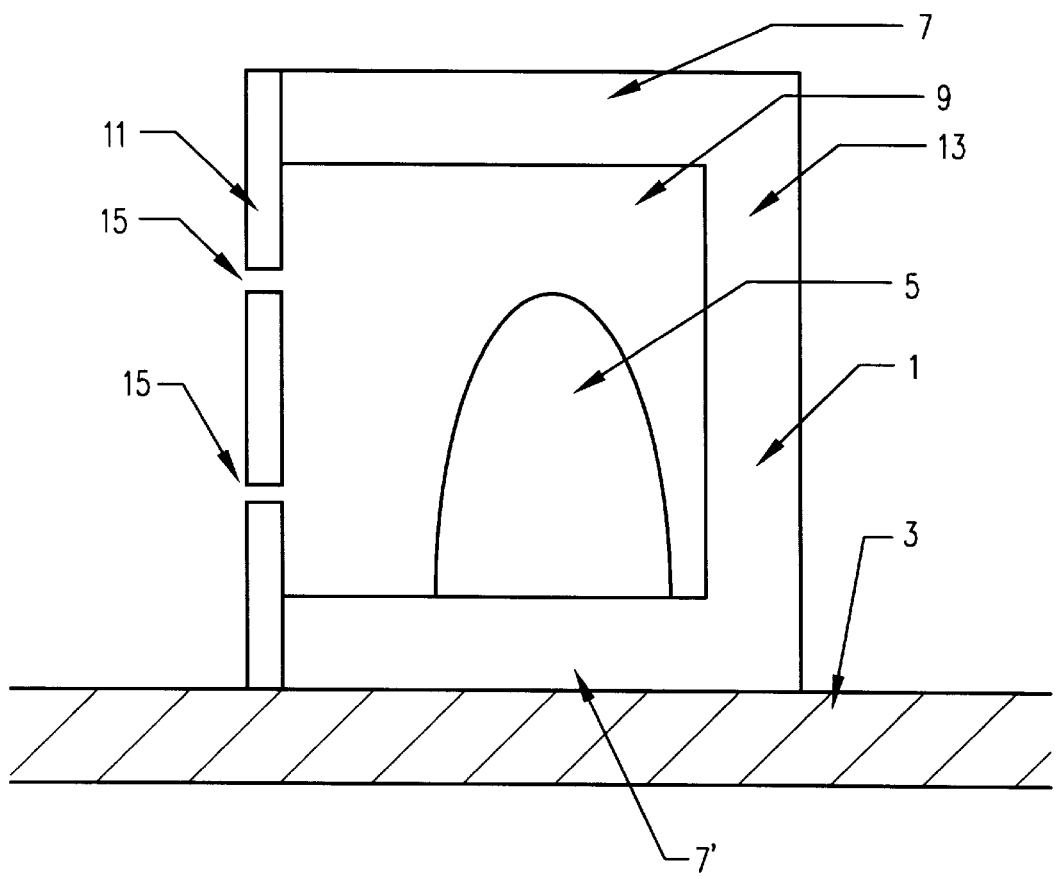
FIG. 2 shows schematically a lateral cross-section through the embodiment of a housing shown in FIG. 1.

FIG. 2 shows schematically a section along line II-II through the housing shown in FIG. 1. It can be seen here than top side 7, bottom side 7' and second short side 13 are thicker than first short side 1. Although not visible in this figure long sides 9 are also thicker than first short side 11. The relative thinness of first short side 11 means that it has a lower heat capacity per unit surface area than the other sides 9, 13 and the top 7 of housing 1 if it is made of the same material as the other sides. This means that the thermal inertia of first short side 11 is lower than that of the other sides and that when there is a temperature difference between the inside of the housing 1 and the surroundings e.g. the surroundings have a lower temperature than that inside the housing then the temperature of short side 11 will fall more quickly than the temperature of the other sides 7, 7', 9, 13 of the housing 1. Consequently water molecules inside the housing 1 at a distance from short side 11 will have more energy and hence move more rapidly than molecules close to short side 11 and outside the housing 1. Therefore statistically more of these more energetic molecules inside the housing will leave the housing 1 through holes 15 than less energetic molecules from outside the housing 1 will enter the housing 1 through holes 15. This will result in the number of water molecules per unit volume inside the housing 1 to decrease.

Figure 3:
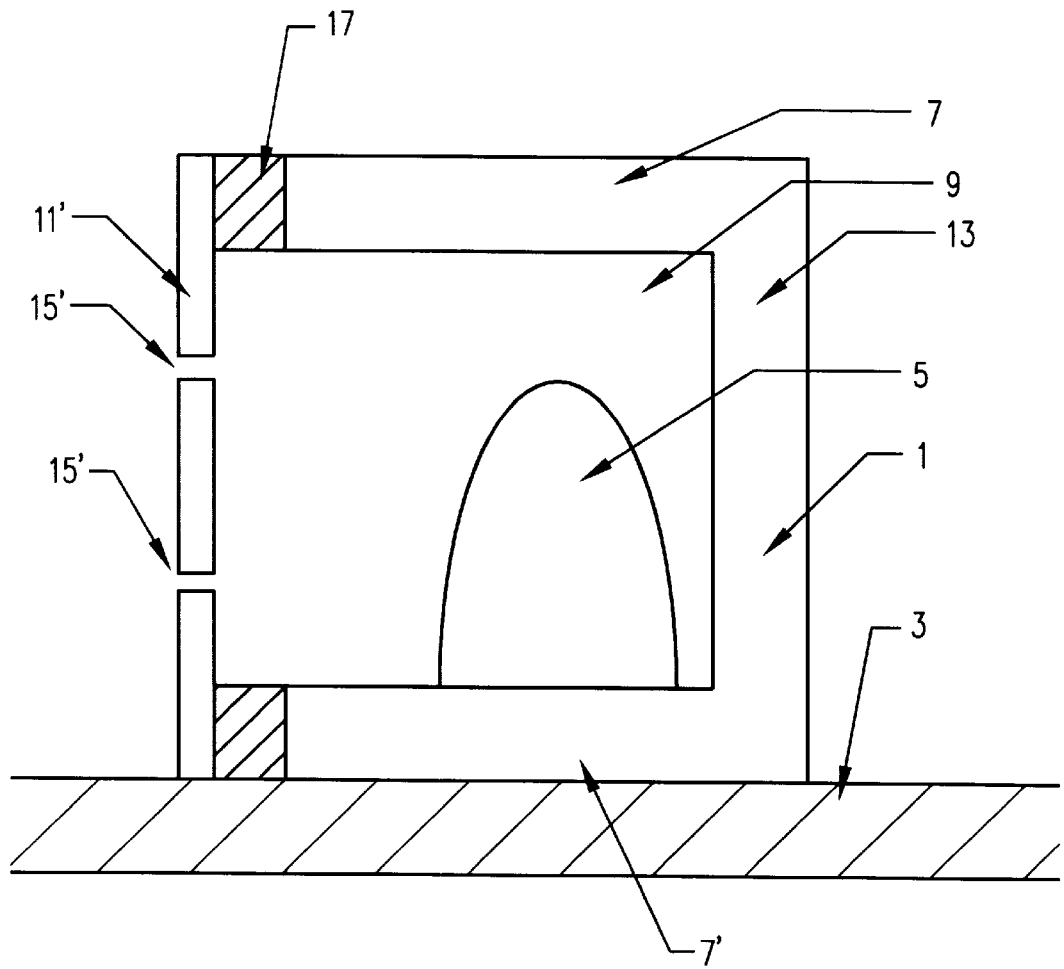
FIG. 3 shows schematically a lateral cross-section through another embodiment of a housing shown in FIG. 1.

FIG. 3 shows a cross-section, similar to that shown in FIG. 2, of a second embodiment of the invention. In this embodiment the first short side 11' is thermally insulated from the rest of the housing 1 by means of a layer 17 of a material have a lower coefficient of thermal conduction than the rest of the housing. This means that the conduction of heat through the sides 7, 7', 9 of the housing to first short side 11' is reduced. This enables the first short side 11' to follow drops in the temperature of the surroundings more closely as heat lost to the surroundings is not replenished by heat conducted though the top and long sides of the housing to the -first short side.

In order to prevent condensation on the inside of the housing the temperature difference between the inside of the first short side 11, 11' and the rest of the interior of the housing should not be too large. It should suitably be between 0.1–2° C. It must be noted that the main transfer of heat between the sides 7, 7', 9, 13 of the housing to the first short side 11, 11' can be, depending on the materials used, by radiation as there are 5 other sides radiating toward it.

In another embodiment of the invention, while the first short side of the housing has the same thickness as the other sides, the material of the first short side 11 is not the same as the material used for other sides of the housing but is chosen to have a lower specific heat capacity in order to permit it to closely follow temperature changes. Thus it could for example be made of steel while the rest of the housing could be made of aluminum as steel has a specific heat capacity which is about 80% that of aluminum. Any suitable casing materials can be used for the respective sides as long as their relative dimensions and physical properties are chosen to achieve the above-mentioned temperature difference.

In the event that the housing is not box-shaped then it is possible that just a portion of one or more sides is/are given a lower thermal inertia than the rest of the housing in order to achieve the above-described water vapour reducing effect.

While the invention has been illustrated as being applied to the short side of a box-like housing it is of course conceivable to apply it to any side of a housing. However the advantageous effects of the invention are reduced if the top side of the housing is perforated as this allows heat to escape by hot air rising through the perforations and leads to an excessive flow of air through the perforations. The invention is not intended to be limited to the embodiments described above but may be modified within the scope of the accompanying claims.

What is claimed is:

1. Method for reducing the number of water vapour molecules per unit volume in a housing having a plurality of sides, the method comprising:

perforating one of said plurality of sides of the housing with at least one through hole and reducing the thermal inertia of the perforated side; and reducing the thermal inertia of the one side of the housing by making it thinner in thickness than the other sides of the housing, all of said sides being made of the same material, so that when surroundings outside of the housing have a lower temperature than an interior of the housing the temperature of said one side with reduced thermal inertia falls more quickly than that of the other sides thereby causing more water molecules to leave the housing through the at least one through hole in the perforated side of the housing than to enter the housing through the at least one through hole.

2. Method for reducing the number of water vapour molecules per unit volume in a housing having sides, the method comprising:

perforating one of said sides of the housing with at least one through hole and providing a thermal insulator between said perforated side and the other sides; and reducing the thermal inertia of the one side of the housing by making it thinner in thickness than the other sides of the housing, all of said sides being made of the same material, so that when surroundings outside of the housing have a lower temperature than an interior of the housing the temperature of said one side with reduced thermal inertia falls more quickly than that of the other sides thereby causing more water molecules to leave the housing through the at least one through hole in the perforated side of the housing than to enter the housing through the at least one through hole.

3. Method for reducing the number of water vapour molecules per unit volume in a housing having a plurality of sides, the method comprising:

perforating one of said plurality of sides of the housing with at least one through hole, reducing the thermal inertia of the perforated side, providing a thermal insulator between said perforated side and the other sides of the housing; and reducing the thermal inertia of the one side of the housing by making it thinner in thickness than the other sides of the housing, all of said sides being made of the same material, so that when surroundings outside of the housing have a lower temperature than an interior of the housing the temperature of said one side with reduced thermal inertia falls more quickly than that of the other sides thereby causing more water molecules to leave the housing through the at least one through hole in the perforated side of the housing than to enter the housing through the at least one through hole.

4. A method of reducing the number of water vapor molecules per unit volume in a housing having a plurality of vertically oriented sides, the method comprising:

perforating one of said plurality of vertically oriented sides of the housing with at least one through hole and reducing the thermal inertia of the vertically oriented perforated side relative to other vertically oriented sides of the housing, providing a thermal insulator between the vertically oriented perforated side and other vertically oriented sides of the housing, and wherein a bottom or base portion of the housing has no perforations or holes defined therein.

* * * * *